United States Patent [19]

Santos

[11] Patent Number: 4,730,163

[45] Date of Patent: Mar. 8, 1988

[54] DEVICE FOR TESTING HIGH-PRESSURE LAMPS AND COMPONENTS USED THEREWITH

[76] Inventor: Luis S. Santos, 42nd Street, E-38, Colinas Montecarlo, Rio Piedras, P.R. 00924

[21] Appl. No.: 711,474

[22] Filed: Mar. 13, 1985

[51] Int. Cl.[4] ............................................ G01R 31/02
[52] U.S. Cl. ........................................ 324/414; 324/408
[58] Field of Search ............... 315/307; 324/133, 403, 324/408, 410, 414; 340/641, 642, 653

[56] References Cited

U.S. PATENT DOCUMENTS

| 3,432,725 | 3/1969 | Rotch | 315/307 |
|---|---|---|---|
| 3,710,157 | 1/1973 | Wright | 340/641 |
| 3,842,343 | 10/1974 | Taylor et al. | 324/414 |
| 3,975,708 | 8/1976 | Lusk et al. | 340/642 |
| 4,163,194 | 7/1979 | Ross | 324/158 D |
| 4,277,728 | 7/1981 | Stevens | 315/307 |
| 4,295,079 | 10/1981 | Otsuka et al. | 340/642 |
| 4,318,031 | 3/1982 | Lonseth et al. | 340/653 |
| 4,496,905 | 1/1985 | Forte et al. | 324/414 |
| 4,593,234 | 6/1986 | Yang | 315/307 |

FOREIGN PATENT DOCUMENTS

| 2414277 | 9/1979 | France | 315/307 |
|---|---|---|---|
| 2535930 | 5/1984 | France | 324/414 |
| WO82/01276 | 4/1982 | PCT Int'l Appl. | 315/307 |
| 0529433 | 1/1977 | U.S.S.R. | 324/403 |

*Primary Examiner*—Reinhard J. Eisenzopf
*Assistant Examiner*—W. Burns
*Attorney, Agent, or Firm*—Abelman Frayne Rezac & Schwab

[57] ABSTRACT

A circuit for testing high-pressure lamps and components used therewith includes standard components which form a conventional high-pressure lamp circuit. The components can be replaced by components under test. Circuits are provided to prevent damage to the device as a result of malfunctions or of normal operation of the components. Provisions are made for measuring efficiency of various lamp systems.

2 Claims, 5 Drawing Figures

DEVICE FOR TESTING HIGH-PRESSURE LAMPS AND COMPONENTS USED THEREWITH

BACKGROUND OF THE INVENTION

The invention relates to testing devices, and more particularly to devices for testing high-pressure lamps and electrical components used to energize them.

High-pressure sodium lamps are now used in outdoor luminaire fixtures. Such lamps are not operated directly from the power supplied to the fixture; a ballast and a starting aid circuit (hereinafter "starting aid") are required to make the lamp work. Furthermore, fixtures of this type may be wired to include a photocell which responds to ambient light and automatically turns the lamp on and off at sunset and sunrise.

Each of these components can fail and a failed component cannot normally be identified using visual examination alone. Such identification requires electrical testing.

When a lineman repairs an outdoor luminaire fixture of the type described, he normally tends to change the lamp, photocell and starting aid until the sysetm works properly. This repair method entails the substantial likelihood that nondefective parts will be taken out and subsequently discarded as defective.

It would be advantageous to provide a device to facilitate the testing of the various electrical parts used in, e.g. high-pressure sodium outdoor luminaire fixtures, so that defective parts could be separated from working ones.

It is one object of the invention to provide a device for conveniently testing high-pressure lamps and components used with them.

It is another object of the invention to provide a device which can be used to test the efficiency of various high-pressure lamp systems.

It is still another object to provide a device which is suitable for use by a lineman to test a wide variety of different components used in high-pressure lamp systems.

It is a further object to generally improve over the prior art.

In accordance with the invention, there is provided a means for testing and energizing a tank circuit of the type which is used in an electrical supply for a high-pressure lamp. There is also provided a means for testing and energizing a ballast of this type. There is further provided a means for testing and energizing a starting aid circuit of this type. There is further provided a means for measuring a voltage across a high-pressure lamp under test, and a means for enabling operation of this measuring means after energization of a starting aid circuit.

In accordance with the invention, components under test are connected, in a suitable high-pressure lamp circuit, to other components which are known to work. The effect of the component under test on the operation of the circuit establishes whether the component is operable or not. Because normal operation of the starting aid can damage a conventional voltmeter circuit such as is needed to test the lamp, operation of this circuit takes place only after such damage cannot occur.

In a preferred embodiment, there is also provided means for disabling the measuring means in response to detection of particular fault conditions. This prevents the device from being burned out by a faulty part under test.

BRIEF DESCRIPTION OF THE DRAWINGS

The invention will be better understood with reference to the following illusrative and non-limiting drawings, in which.

DETAILED DESCRIPTION OF PREFERRED EMBODIMENTS

Figure 1:
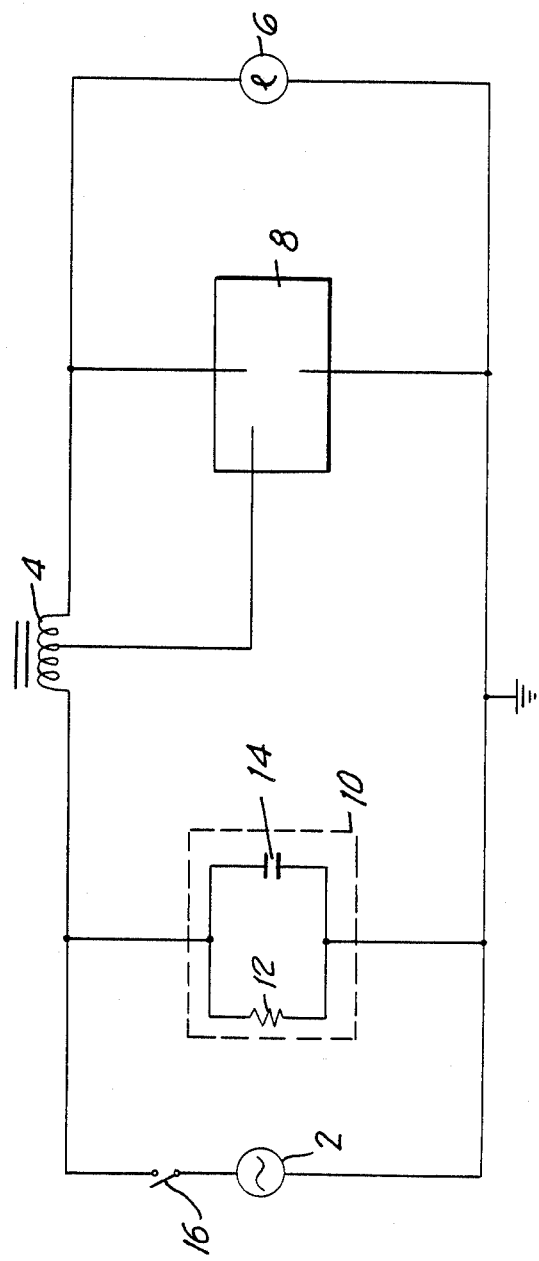
FIG. 1 is a schematic diagram of a high-pressure sodium lamp circuit.

A conventional high-pressure sodium lamp circuit will be explained with reference to FIG. 1. Power is supplied by an AC source 2. One side of the source 2 is connected to one end of a ballast 4; the other side of the source 2 is grounded. A high-pressure sodium lamp 6 is connected between the other end of the ballast 4 and ground. An electronic starting aid 8 is connected across the lamp 6 and is connected to the tap of the ballast 4. A tank circuit 10 which includes a resistor 12 in parallel with a capacitor 14 is connected across the source 2.

Figure 2:
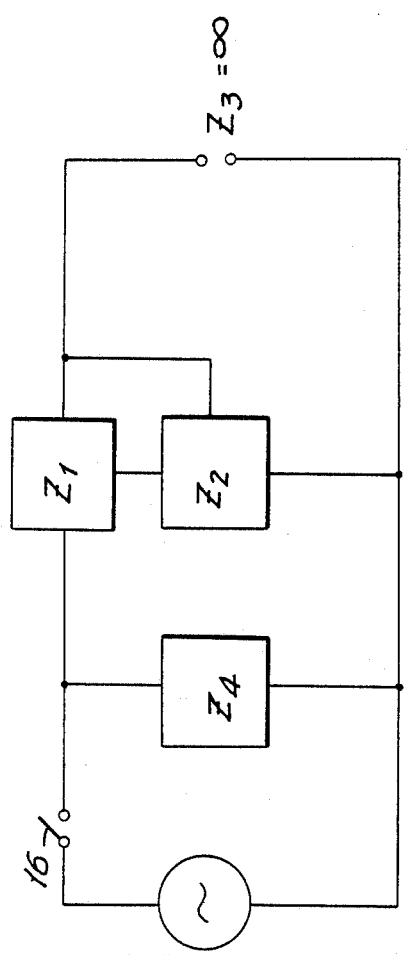
FIG. 2 shows the impedences of the circuit of FIG. 1 before the lamp becomes conductive.

The lamp 6 creates light by an arc struck between its electrodes (not shown). Such an arc cannot be created unless the lamp 6 has been ionized. Thus, when the lamp 6 is nonconductive, the impedances of the circuit shown in FIG. 1 are represented by the schematic equivalent circuit shown in FIG. 2; the impedance of the tank circuit 10 is $Z_4$, the impedance of the ballast 4 is $Z_1$, the impedance of the starting aid 8 is $Z_2$, and the impedance $Z_3$ of the lamp 6 is infinite.

Figure 3:
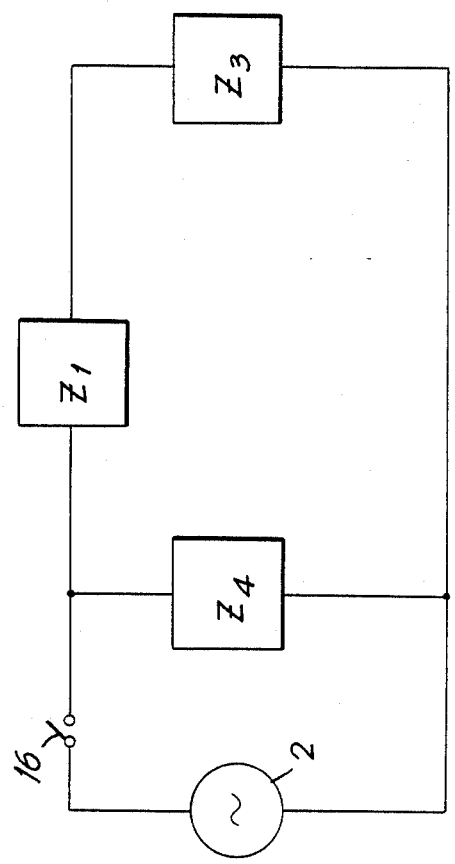
FIG. 3 shows the impedences of the circuit of FIG. 1 after the lamp becomes conductive.

When the lamp system is turned on by closure of switch 16 (which may correspond to a photocell under test as described below) the starting aid 8 produces high voltage (perhaps 2500–4000 V) and high frequency (perhaps 0.25 MHz) pulses for a predetermined time (perhaps 2 seconds). This ionizes the lamp 6 and reduces its impedance to perhaps 48–52 ohms. The lamp 6 then becomes conductive and produces light. Since the impedance of the starting aid 8 is extremely high (on the order of megohms) relative to the low impedance of the lamp 6, the starting aid 8 is essentially out of the circuit (as is shown in FIG. 3).

Because the impedance of the lamp 6 changes so rapidly, it is necessary to limit the voltage across the lamp 6 to prevent it from burning out. This is the function of the ballast 4. As schematically shown, the ballast 4 is a tapped coil wrapped around a flux-conducting core, but the ballast 4 may alternately be an electronic circuit or some other voltage limiting device. The construction of the ballast 4 is not part of the invention.

The purpose of the tank circuit 10 is to optimize the steady-state impedance match between the source 2 and the ballast 4 and lamp 6. Changing the value of the resistor 12 changes the power factor of the lamp 6; changing the value of the capacitor 14 changes the efficiency of the lamp 6.

Figure 4:
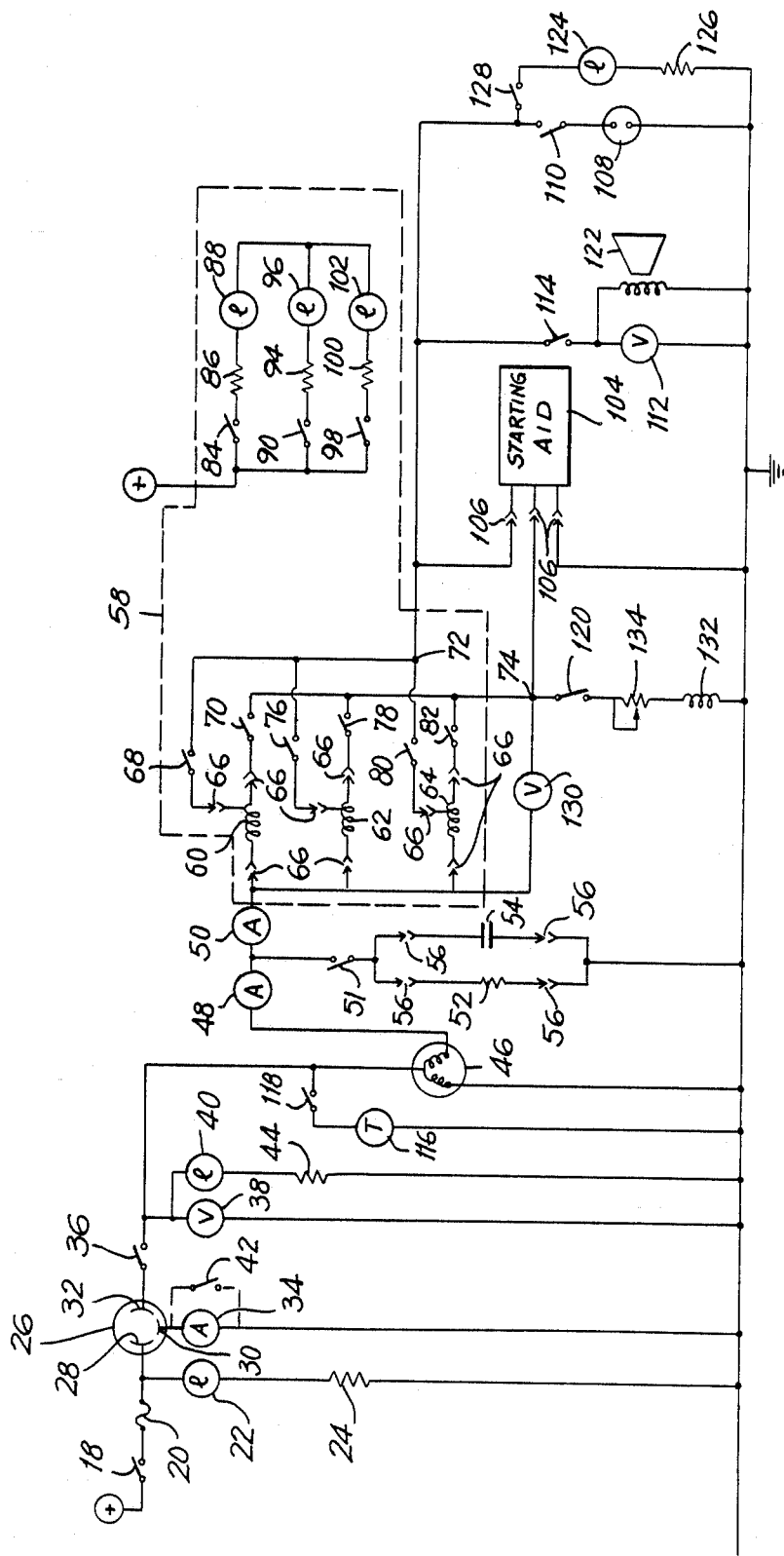
FIG. 4 is a schematic diagram of one section of a preferred embodiment.
Figure 5:
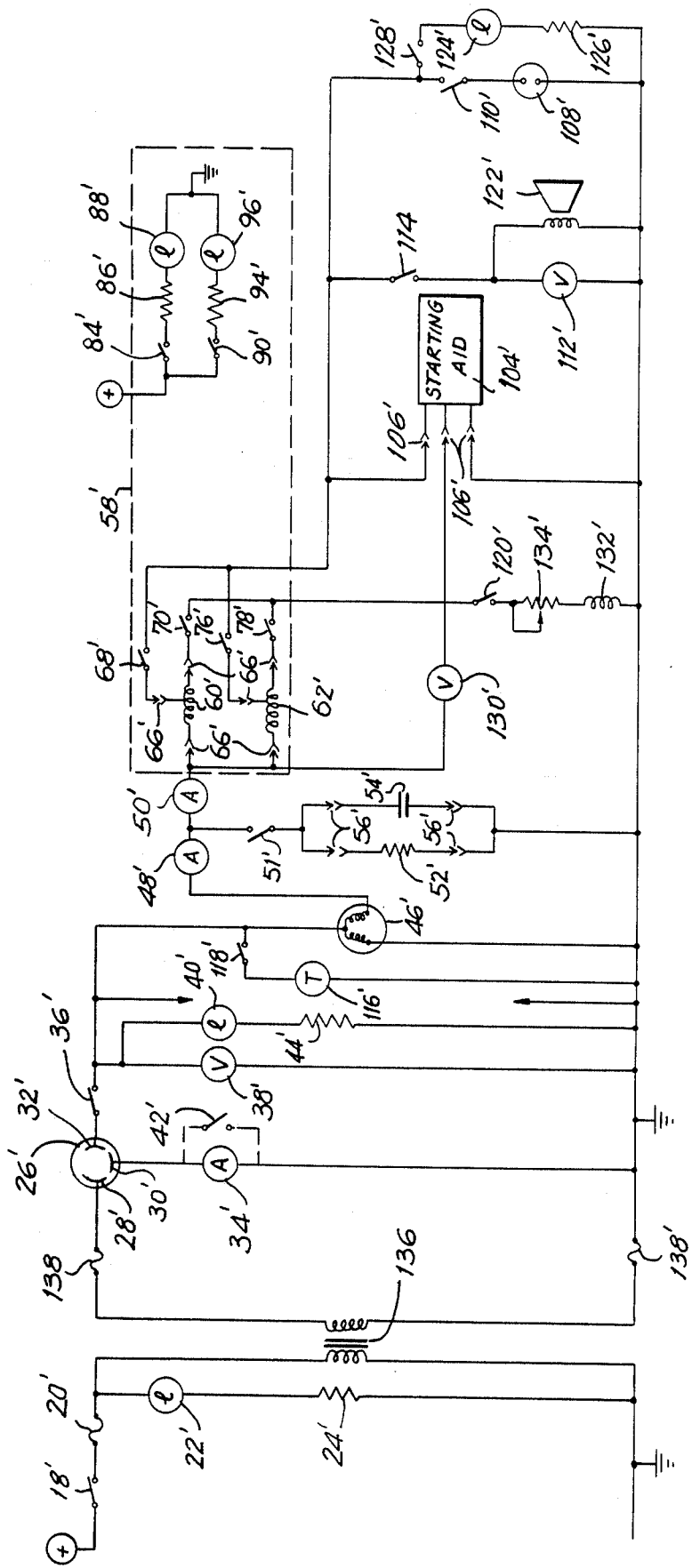
FIG. 5 is a schematic diagram of another section of the preferred embodiment.

A preferred embodiment of the invention has two sections, which are shown separately in FIGS. 4 and 5. FIG. 4 shows the section which tests components for use on 120 VAC; FIG. 5 shows the section which tests components for use on 240 VAC. These voltages are not part of the invention; they have been chosen to correspond to standard voltages used in systems of this type.

The operation of these two sections is conceptually identical. Therefore, the operation of the preferred embodiment will be explained only with reference to FIG. 4, except where the two sections differ. To facilitate understanding of the correspondance between the two sections, their corresponding parts are identified by corresponding reference numerals.

The preferred embodiment forms a circuit which is the electrical equivalent of a high-pressure sodium lamp circuit. Testing is carried out by connecting in circuit with standard components the components under test, and interpreting the readings of the pilot lights and meters hereinafter described. A power switch 18 turns the test circuit on and off. A fuse 20 is in series with the switch 18. After the fuse 20 is connected a pilot light 22 which lights up when power has been turned on. In this example, the pilot light 22 is in series with a resistor 24, but this is not part of the invention.

A standard photocell socket 26 is connected after the fuse 20. This socket has three electrodes: 28, 30, and 32. Power is supplied to a tested photocell through electrodes 28 and 30, and electrode 32 is supposed to be conductive or nonconductive depending on ambient light. To test a standard photocell, an ammeter 34 is connected to electrode 30; the ammeter 34 shows the relay loading current for the photocell (not shown).

A switch 36 is connected to the electrode 32. After the switch 36 is connected a voltmeter 38, which is in parallel with a pilot light 40. (Light 40 is in series with a resistor 44, but this is not part of the invention.) With switch 36 closed and a working photocell under test, the light 40 will turn on and off when the photocell window is covered and uncovered; the voltmeter 38 quantifies the operation of the photocell contacts. Once the operation of the photocell has been checked, a dummy plug (not shown) can be put into the socket 26, and the ammeter 34 shunted by a switch 42. Alternatively, a working photocell under test can be left in place with its window covered.

After the switch 36, there is connected a wattmeter 46. The wattmeter 46 measures the power consumed by the rest of the circuitry, permitting verification of lamp circuit specifications.

After the wattmeter 46, there are connected in series two ammeters 48 and 50. The ammeters 48 and 50 are provided to permit calculation of the high power factor improvement of the tank circuit discussed below. This will be explained later.

A tank circuit is connected between ground and the common junction point of the ammeters 48 and 50. This tank circuit has two parallel branches; in one branch there can be a resistor 52 and in the other a capacitor 54. These components are connected through e.g. banana jacks 56. If testing of other components is to be carried out using the standard resistor 52 and the capacitor 54, the jacks 56 are connected so that these two components are in circuit; if another resistor and/or capacitor is to be tested instead, the resistor 52 and/or the capacitor 54 are disconnected and and replaced by the components under test.

After this tank circuit, there is connected a ballast selector and indicator circuit generally indicated by circuit block 58. This ballast selector and indicator circuit 58 has the function of permitting the selection of one of three circuit branches for use with the lamp under test and identifying for the user the branch so selected. Each of these branches may be connected (using appropriate connectors) to contain either a standard ballast or a ballast to be tested. (The ballasts may be coils or circuits; their construction is not part of the invention.)

Three standard ballasts 60, 62 and 64 are provided. Ballast 60 is a 70 watt ballast, ballast 62 is a 100 watt ballast, and ballast 64 is a 150 watt ballast. Each ballast is connected via appropriate connectors 66, so a ballast under test may be substituted for a standard ballast.

Two switches 68 and 70 connect the tap and end of the ballast 60 to circuit points 72 and 74 respectively. Two switches 76 and 78 connect the tap and end of the ballast 62 to circuit points 72 and 74 respectively. Two switches 80 and 82 connect the tap and end of the ballast 64 to circuit points 72 and 74 respectively.

The switches 68 and 70 are ganged together, and are also ganged to a switch 84. The switch 84 is placed in series with a resistor 86 and a pilot light 88. Since the switches 68, 70 and 84 are all opened and closed together, when the ballast 60 is placed in circuit (or when a ballast under test is substituted for the ballast 60 and likewise placed in circuit) the pilot light 88 lights up, indicating which of the ballasts 60, 62 and 64 has been selected. The same holds true for the switches 76, 78, and 90; when these three switches are closed, the ballast 62 or its substitute is placed in circuit and current flows through a resistor 94 to light a pilot light 96. Switches 80, 82, and 98 work in the same way to light a pilot light 102 when the ballast 64 or its substitute has been placed in circuit.

If desired, the switches 68, 70, 84, 76, 78, 90, 80, 82 and 98 may be ganged together in a multiple position rotary switch. It is also possible to use electronic switching circuitry to accomplish the results described above.

A standard 150 watt starting aid 104 is connected as by appropriate connectors 106 to circuit point 72, circuit point 74, and ground. The starting aid 104 has a voltage which can be set between 2500 volts and 4000 volts, a frequency of about 0.25 MHz, and an ionizing voltage time of about 2 seconds. The starting aid 104 can be used to test other components, or can be replaced by a starting aid under test.

A standard mogul-type high-pressure sodium lamp socket 108 is connected across circuit point 72 and ground through a switch 110. This socket 108 receives a high-pressure sodium lamp (not shown) for testing.

Before the operation of the remaining parts shown in FIG. 4 is discussed, circuit operation using a normal tank circuit, ballast, and starting aid will be described. (The switch 110 is assumed to be closed, a working photocell with its window covered or a dummy photocell is assumed to be in the socket 26, and the switch 51 which connects the tank circuit is assumed to be closed.) When the switch 36 is closed, current flows through the voltmeter 38 and the pilot light 40. This indicates that the photocell is working. Current is supplied to the resistor 52 and the capacitor 54 in the tank circuit, one of the ballasts 60, 62 or 64, and to the starting aid 104.

The starting aid 104 produces high-voltage, high-frequency pulses between circuit point 72 and ground for about 2 seconds. This ionizes the lamp in socket 108 and causes current to begin to flow in it. The current through the lamp rapidly increases and the starting aid stops producing ionizing pulses, and the voltage at circuit point 72 drops to approximately 52-55 volts. The reading of the wattmeter 46 then represents the power used by the system, the reading of the ammeter 48 then represents the current used by the system, and the reading of the ammeter 50 then represents the current flowing through the lamp and the ballast. Since the reading of the ammeter 48 will always be greater than the reading of the ammeter 50, the difference between the two permits the efficiency of the tank circuit to be calculated.

A voltmeter 112 is in series with a contact set 114 and both are in parallel with the socket 108. The purpose of the voltmeter 112 is to moniter the voltage across a lamp under test. If the voltmeter 112 were connected directly across the socket 108, the high-voltage pulses produced by the starting aid 104 during the ionization phase of the lamp would burn the voltmeter 112 out. Therefore, the contact set 114 is closed only after the ionization phase of the starting aid 104 is over.

This is accomplished by the use of a timer 116, which is connected after the switch 36 through a normally closed contact set 118 described in more detail below. The timer 116 controls two contact sets: contact set 114 and and contact set 120 (described below).

The timer 116 is adjusted to close the contact sets 114 and 120 approximately 5 seconds after the switch 36 is closed. This insures that the voltmeter 112 is not connected across the lamp under test until after the starting aid 104 has finished its ionization phase.

An alarm such as a buzzer 122 may be connected in parallel with the voltmeter 112. When the voltage across a lamp under test is too high, this indicates either a defective lamp or a defective starting aid. The overvoltage condition will be reflected in a high reading of the voltmeter 112, and if the buzzer 122 is provided the overvoltage condition will be also be indicated by an audio indication. The buzzer 122 is chosen such that only overvoltage conditions have sufficient voltage to make it produce an audio alarm.

The pilot light 124, resistor 126, switch 128 and switch 110 are provided to isolate a defective starting aid under certain circumstances. If a lamp under test does not light up, the voltage across it should be low. The pilot light 124 and resistor 126 are chosen such that if there is enough voltage across a lamp under test to light the pilot light 124, the starting aid is defective. For this purpose, switches 110 and 128 are ganged together so that when the switch 110 is closed, the switch 128 is open and vice versa. The switches 110 and 128 are thrown between 2 and 4 seconds after the switch 36 is closed, if the lamp under test fails to light.

A voltmeter 130 is placed across the three branches in the ballast selector and indicator circuit 58. This is for the purpose of monitering the voltage across the ballast during a test.

Under certain circumstances, the voltage between circuit point 72 and ground will always exceed the rating of the voltmeter 112. Under these circumstances, the voltage at circuit point 74 will likewise be excessive.

To prevent the voltmeter 112 from being burned out under these circumstances, there is provided a relay having a coil 132, which operates the contact set 118. The coil 132 is connected in series with a potentiometer 134 and the contact set 120, so that these three components are connected between circuit point 74 and ground.

Contact set 118 is normally closed. Thus, after closure of the switch 36, the timer 116 starts the 5 second delay period and subsequently closes the contact sets 114 and 120. If the voltage at circuit point 74 is excessive, there is sufficient voltage through the coil 132 to open the contact set 118, to disable the timer 116, and to open the contact sets 114 and 120 before any damage occurs to the voltmeter 112. The potentiometer 134 is provided to adjust the voltage at which the contact set 118 opens.

In FIG. 5, there is provided a transformer 136. Both ends of the secondary winding of the transformer 136 are fused with fuses 138. The transformer 136 steps up the 120 VAC primary supply to 240 VAC for testing 240 VAC lamps and components. All the components to the right of the transformer 136 in FIG. 5 are chosen to operate at this voltage; the starting aid 104' is rated up to 400 watts. There are only two branches in the ballast selector and indicator circuit 58' because standard ballasts for 240 VAC come in 200 watt (ballast 60') and 400 watt (ballast 62') versions. However, in neither the ballast selector and indicator circuit 58 nor the ballast selector and indicator circuit 58' is the number of branches a part of the invention; there can be any number of branches depending on the number of models of ballasts and lamps which are to be tested.

The meters may be either of the analog or of the digital type; the type of meter used is not part of the invention. It is likewise unnecessary to the invention that there be two sections, or that the sections use, e.g., different timers, wattmeters, etc.

Although a preferred embodiment has been described above, the scope of the invention is limited only by the following claims,

I claim:

1. A portable test device for use in dynamic testing of circuit components of a high-pressure ionized vapor luminaire, such as a sodium vapor lamp, said circuit components including a photoelectronic switch, a tank circuit, a ballast, a voltage multiplier starter circuit, and a said high-pressure ionized vapor luminaire, said test device including:

a first test section incorporating a selectively replaceable photoelectronic switch, said photoelectronic switch being substitutable by said photoelectronic switch of said circuit components, said first test section including means for indicating the extent of operability of a said photoelectronic switch inserted into said first test section;

a second test section connected in parallel with said first test section and incorporating a selectively replaceable tank circuit device, said selectively replaceable tank circuit device being substitutable by said tank circuit device of said circuit components, and, said second test section including means for indicating the extent of operability of a said tank circuit device inserted into said second test section;

a third test section connected in series relation with said second test section, said third test section incorporating one of a plurality of selectively replaceable ballast circuits, said ballast of said circuit components being substitutable for said one selectively replaceable ballast circuit, and, means for indicating the extent of operability of said selected ballast circuit inserted into said third test section;

a fourth test section connected in parallel with said third test section and incorporating a selectively replaceable voltage multiplier starter circuit, said voltage multiplier starter circuit being replaceable by said voltage multiplier starter circuit of said circuit components, and, means for indicating the extent of operability of the selected voltage multiplier starter circuit inserted into said fourth test section;

a fifth test section connected in parallel with said fourth test section, and incorporating a selectively replaceable high-pressure ionized vapor luminaire, said luminaire being replaceable by said luminaire of said circuit components, said fifth test section including a device connected in parallel with said voltage multiplier starter circuit, for giving an audible warning of excessive voltage developed by said voltage multiplier starter circuit.

whereby, any one of said circuit components of said luminaire can be selectively inserted into said test device in combination with any other component of said luminaire in order to prove out the respective circuit components of said luminaire, each said circuit component being replaceable in said test device by a standard component of determined characteristics and known operability.

2. The test device of claim 1, further including a step-down transformer interposed in a power supply line to said device.

* * * * *